(12) United States Patent
Hilgers et al.

(10) Patent No.: US 11,600,767 B2
(45) Date of Patent: Mar. 7, 2023

(54) ACTUATOR DEVICE AND METHOD FOR LIMITING THERMAL DRIFT

(71) Applicant: KONINKLIJKE PHILIPS N.V., Eindhoven (NL)

(72) Inventors: Achim Hilgers, Eindhoven (NL); Daan Anton Van Den Ende, Eindhoven (NL); Cornelis Petrus Hendriks, Eindhoven (NL); Ronald Antonie Hovenkamp, Eindhoven (NL); Mark Thomas Johnson, Eindhoven (NL); Eduard Gerard Marie Pelssers, Eindhoven (NL); Franciscus Johannes Gerardus Hakkens, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 461 days.

(21) Appl. No.: 16/642,919

(22) PCT Filed: Aug. 28, 2018

(86) PCT No.: PCT/EP2018/073099
§ 371 (c)(1),
(2) Date: Feb. 28, 2020

(87) PCT Pub. No.: WO2019/042977
PCT Pub. Date: Mar. 7, 2019

(65) Prior Publication Data
US 2020/0343440 A1      Oct. 29, 2020

(30) Foreign Application Priority Data
Aug. 28, 2017  (EP) .................................... 17188169

(51) Int. Cl.
*H01L 41/193*  (2006.01)
*H01L 41/04*   (2006.01)
*H01L 41/09*   (2006.01)

(52) U.S. Cl.
CPC .......... *H01L 41/193* (2013.01); *H01L 41/042* (2013.01); *H01L 41/096* (2013.01)

(58) Field of Classification Search
None
See application file for complete search history.

(56) References Cited

U.S. PATENT DOCUMENTS

| 5,685,149 A | 11/1997 | Schneider et al. |
| 7,701,115 B2 | 4/2010 | Higashionji et al. |

(Continued)

FOREIGN PATENT DOCUMENTS

| JP | H06-104502 A | 4/1994 |
| JP | H11-150959 A | 6/1999 |
| WO | 2010073213 A2 | 7/2010 |
| WO | 2017037117 A1 | 3/2017 |

*Primary Examiner* — Scott B Geyer
(74) *Attorney, Agent, or Firm* — Schott, P.C.

(57) ABSTRACT

An actuator device has a temperature sensing means and a controller adapted to apply a high frequency AC signal to stimulate internal self-heating to thereby maintain a temperature of an actuator member of the device at a certain fixed temperature, this temperature being elevated with respect to an initial temperature of the actuator member. This ensures that thermal drift may be mitigated or eliminated by compensating for any changes in environmental temperature through raising or lowering the level of the heating signal.

15 Claims, 4 Drawing Sheets

(56) References Cited

U.S. PATENT DOCUMENTS

| | | | |
|---|---|---|---|
| 8,237,324 B2* | 8/2012 | Pei | F03G 7/005 |
| | | | 310/306 |
| 9,478,728 B2* | 10/2016 | Capobianco | F04B 43/046 |
| 9,502,635 B2* | 11/2016 | Andosca | H01L 41/22 |
| 11,276,811 B2* | 3/2022 | Hilgers | H01L 41/193 |
| 2005/0103706 A1* | 5/2005 | Bennett | H02N 11/006 |
| | | | 210/243 |
| 2010/0141085 A1* | 6/2010 | Wu | F03G 7/00 |
| | | | 977/773 |
| 2012/0038815 A1 | 2/2012 | Kato et al. | |
| 2012/0086366 A1* | 4/2012 | Anderson | H02N 2/062 |
| | | | 318/116 |
| 2012/0235543 A1* | 9/2012 | Suda | F03G 7/005 |
| | | | 977/788 |
| 2013/0335354 A1* | 12/2013 | Zellers | G06F 3/016 |
| | | | 345/173 |
| 2014/0139329 A1* | 5/2014 | Ramstein | G08B 6/00 |
| | | | 340/407.2 |
| 2014/0139436 A1* | 5/2014 | Ramstein | H01L 41/0986 |
| | | | 310/331 |
| 2014/0339953 A1 | 11/2014 | Li et al. | |
| 2015/0061703 A1* | 3/2015 | Jiang | G06F 3/016 |
| | | | 324/686 |
| 2016/0049576 A1* | 2/2016 | Levatich | H01L 41/0825 |
| | | | 310/332 |
| 2020/0052184 A1* | 2/2020 | Hilgers | H01L 41/083 |
| 2020/0235278 A1* | 7/2020 | Van Den Ende | H01L 41/183 |

* cited by examiner

ACTUATOR DEVICE AND METHOD FOR LIMITING THERMAL DRIFT

CROSS-REFERENCE TO RELATED APPLICATION

This application is a U.S. National Phase application under 35 U.S.C. § 371 of International Application No. PCT/EP2018/073099, filed on Aug. 28, 2018, which claims the benefit of European Application No. 17188169.1 filed on Aug. 28, 2017. These applications are hereby incorporated by reference herein.

FIELD OF THE INVENTION

This invention relates to an actuator device comprising an electroactive polymer, and a method of actuation based on control of the same.

BACKGROUND OF THE INVENTION

Electroactive materials (EAMs) are a class of materials within the field of electrically responsive materials. When implemented in an actuation device, subjecting an EAM to an electrical drive signal can make it change in size and/or shape. This effect can be used for actuation and sensing purposes. There exist inorganic and organic EAMs. One particular kind of organic EAM is that of electroactive polymers (EAPs).

Electroactive polymers (EAPs) are an emerging class of materials within the field of electrically responsive materials. EAPs can work as sensors or actuators and can easily be manufactured into various shapes allowing easy integration into a large variety of systems.

Materials have been developed with characteristics such as actuation stress and strain which have improved significantly over the last ten years. Technology risks have been reduced to acceptable levels for product development so that EAPs are commercially and technically becoming of increasing interest. Advantages of EAPs include low power, small form factor, flexibility, noiseless operation, accuracy, the possibility of high resolution, fast response times, and cyclic actuation.

The improved performance and particular advantages of EAP material give rise to applicability to new applications.

An EAP device can be used in any application in which a small amount of movement of a component or feature is desired, based on electric actuation. Similarly, the technology can be used for sensing small movements.

The use of EAPs enables functions which were not possible before, or offers a big advantage over common sensor/actuator solutions, due to the combination of a relatively large deformation and force in a small volume or thin form factor, compared to common actuators. EAPs also give noiseless operation, accurate electronic control, fast response, and a large range of possible actuation frequencies, such as 0-1 MHz, most typically below 20 kHz.

Known electroactive material based actuators experience significant thermal drift. Thermal drift means uncontrolled drift or variation in the actuation displacement of the actuator, caused by changes in environmental temperature. It occurs because electroactive material expands with increasing temperature which causes non-negligible shifts in the actuation displacement of the actuator.

Thermal drift renders the actuators inaccurate, especially when applied in non-conditioned environments, for instance when incorporated into medical probes which, upon entry to the human body, become subject to significant increases in temperature.

Means for overcoming the difficulties of thermal drift in EAM based actuators are therefore desired.

SUMMARY OF THE INVENTION

The invention is defined by the claims.

According to an aspect of the invention, there is provided an actuator member comprising an electroactive polymer deformable in response to electrical stimulation; a temperature sensing means adapted to obtain a measure of a temperature at the actuator member; and a controller operatively coupled to the temperature sensing means and arranged to supply to the actuator member an electrical stimulus comprising an actuation signal for deforming the actuator member, and an AC heating signal superposed with the actuation signal for inducing heating of the electroactive material, wherein the controller is adapted to monitor an output of the temperature sensing means and adjust an amplitude and/or frequency of the AC heating signal in dependence upon the output so as to adjust the heating to thereby maintain the temperature of the actuator member at a set level, the set level being a level elevated relative to an initial non-heated temperature of the actuator member.

Embodiments of the invention are based on maintaining the actuator member at a slight temperature elevation relative to an initial temperature of the actuator member, through a mechanism of internal self-heating. This provides two main advantageous effects in terms of limiting thermal drift. First, by keeping the EAP at a slightly elevated temperature relative to its initial temperature, small fluctuations in ambient environmental temperate have a lesser effect upon the actuator in terms of actuation drift. Secondly, by maintaining a persistent elevated temperature, changes both down and up in environmental temperature can be compensated, by either increasing or decreasing the amplitude or frequency of the AC heating signal.

The latter contrasts for example with a system in which the temperature of the actuator member is adjusted so as to maintain it exactly equal to its initial temperature. Here, decreases in temperature may be compensated for (by inducing heating), but any increase in temperature cannot be compensated (since the AC heating signal cannot create a cooling effect). The present invention resolves this by maintaining an initial elevation in temperature, so that any increase in ambient temperature can be compensated by reducing the power of the heating signal, thereby bringing the temperature back down to its initial level.

The present invention thus provides an active temperature buffer, enabling mitigation of displacement drift.

The controller is adapted to maintain the temperature at a set level, said level being elevated relative to an initial non-heated temperature of the actuator member. This may be achieved in at least two different ways. The first and most simple is to apply, upon activation of the device, a pre-set heating level, e.g. an AC heating signal of pre-set amplitude and frequency. Whatever the initial temperature of the member, the set heating level would transfer a determined amount of heat and thus would be such as to increase the temperature by some given amount. The temperature at the actuator member after application of this set heating level defines the set temperature level at which the actuator member is to be maintained. This may be sensed using the temperature sensing means, and may for example be stored or recorded. The controller then continues to monitor the temperature at the actuator member and responds to any changes by adjusting the heating level to maintain it at the set level.

The second means would be to obtain a measure of the initial temperature of the actuator member in the absence of any active heating using the temperature sensing means. This may be stored or recorded. A pre-set temperature offset may then be added to this temperature, and the controller adapted to then raise and maintain the actuator member temperature at this calculated offset temperature.

The controller is adapted to maintain the temperature at the initial elevated level. This is achieved using a temperature sensing means which senses a temperature at the actuator member. By this may be meant a temperature at or proximal to, including for instance a temperature within, a temperature at the surface of, or a temperature close to the actuator member.

The level of heating induced by the AC heating signal is dependent upon both the amplitude and frequency of the signal. Either or both may be used to control the temperature of or at the actuator member.

The actuation signal may by way of example be either an AC or a DC signal, where by DC is meant a non-alternating or non-sinusoidal signal, although an applied DC signal may be changed in a discrete manner, and may be so changed on a regular basis. A DC actuation signal may be changed in polarity occasionally or regularly. There may be applied an actuation signal of slowly varying voltage or current, where this may be sinusoidal variation, or may be a non-sinusoidal time-varying DC signal. Where the actuation signal is an AC signal, preferably the frequency of the actuation signal is lower than that of the AC heating signal.

In preferred examples, a frequency of the AC heating signal is maintained at a level greater than a mechanical resonance frequency of the actuator member, or at least of the EAP comprised by the actuator member. The effect of this is to avoid the heating signal having any significant actuation effect, i.e. to avoid inducing significant mechanical oscillation of the actuator member through the heating signal.

The mechanical resonance frequency of a structure is the frequency at which a structure will naturally tend to oscillate, upon being displaced from its equilibrium position, and is determined by intrinsic structural properties of the structure (e.g. geometry, size, shape, thickness etc.)

Preferably, the AC heating signal may for example be at a frequency at least 10 Hz higher than the mechanical resonance frequency of the actuator member.

Advantageously it may also be higher than the switching frequency of the EAP molecules (that is the limiting frequency at which the molecules of the EAP can tolerate switches in polarization, hence limiting the frequency at which the EAP can be oscillated). If the heating frequency is higher than the switching frequency, the EAP will effectively be unable to accommodate the signal as a drive signal, and mechanical oscillation will accordingly be limited.

In examples, said set temperature level may be elevated in addition relative to a reference ambient environmental temperature. Optionally the actuator device may comprise an environmental temperature sensing means for acquiring the reference ambient environmental temperature.

In most cases, the initial temperature of the actuator member will substantially match the initial environmental temperature. Hence, a temperature elevated relative to the initial member temperature will automatically achieve a temperature elevated relative to the ambient. However, the controller is in accordance with these examples adapted to ensure that the initial temperature is above both the initial member temperature and the environmental temperature.

The reference ambient temperature may simply be an anticipated or estimated temperature of the environment, for instance being pre-stored in a memory of the controller or the device. Alternatively, the reference ambient temperature may be acquired, for example sensed, for instance by providing an ambient temperature sensing means operatively coupled to the controller.

Optionally, the set (temperature) level may be a level elevated by a pre-determined amount relative to said initial non-heated temperature of the actuator member. This has the advantage of ensuring that, at least initially, the induced temperature elevation provides a temperature buffer of a known amount.

In particular examples, said set temperature level may be elevated from 2° C. to 7° C. higher than the initial non-heated actuator member temperature and/or the reference ambient environmental temperature.

To maintain the temperature of the actuator member, the controller may be adapted to decrease the frequency and/or amplitude of the AC heating signal in response to a sensed increase in temperature of the actuator member, and to increase the frequency and/or amplitude of the AC heating signal in response to a sensed decrease in temperature of the actuator member.

In particular examples, the frequency of the AC heating signal may be controlled to be from 100 Hz to 1000 Hz. In most cases, this frequency will be greater than the mechanical resonance frequency of the actuator member, and sufficiently greater than the resonance frequency to ensure that the heating signal does not cause significant mechanical oscillations in the EAP.

In accordance with at least one set of embodiments, the temperature sensing means comprises a temperature sensor thermally coupled to the actuator member.

In examples, the temperature sensor may be directly coupled to the actuator member or to a backing layer of the actuator member.

It is preferable that any temperature sensor be positioned as close to the actuator member, or having as effective a thermal coupling with the actuator member as possible. This ensures that the temperature sensor follows the temperature of the actuator member as closely as possible.

In accordance with at least a further set of embodiments, the controller may be adapted to control the actuator member to function as a temperature sensing means by applying to the electroactive polymer of the actuator member an AC sensing signal of a frequency higher than that of the AC heating signal. This mechanism is explained in more detail for instance in WO 2017/037117 (see in particular for instance page 19, line 28 to page 20, line 3 which explains how to isolate temperature measurements).

The AC sensing signal preferably has an amplitude which is lower than an amplitude of the AC heating signal, and which is lower than a magnitude or amplitude of the actuation signal. This avoids the sensing signal interfering with either the heating operation implemented by the AC heating signal or the actuation behavior, controlled by the actuation signal.

The method is based on applying a low amplitude high-frequency signal to the actuator member. The impedance of the applied signal is directly related to the temperature of the actuator member. By monitoring the impedance, a measure of the internal temperature of the actuator member may be derived. By performing a suitable calibration procedure, absolute values of temperature can be obtained.

By ensuring this frequency is higher than the heating signal, temperature sensing and heating can be performed simultaneously, and without interfering with one another.

As noted, the AC sensing signal may be applied simultaneously with the AC heating signal. Alternatively, the AC sensing signal and AC heating signal may be applied sequentially, for instance in alternating fashion.

In examples, the frequency of the AC sensing signal may be controlled to be from 10 kHz to 100 kHz. Advantageously, the frequency may be greater than 20 kHz.

In embodiments, the actuator device may further comprise a thermal insulation material arranged surrounding the actuator member. This increases the heat capacity of the device. This ensures that sensitivity of the device to changes in environmental temperature is reduced, i.e. a greater change in ambient temperature is required to induce a certain change in temperature of the actuator member. This improves thermal displacement stability of the actuator member and reduces the effects of thermal drift.

Optionally, the thermal insulation material may comprise a long chain hydrocarbon material such as a natural or synthetic rubber. These are advantageous since they are flexible and have low thermal conductivity, rendering them particularly suited for use as a sealing or insulating material for a bending actuator.

In accordance with one or more embodiments, at least a portion of the actuator member may comprise a long chain hydrocarbon material. This may be in the form for instance of particles embedded or dispersed within the electroactive polymer material, or for instance in the form of a backing layer of the actuator member. This increases the heat capacity of the actuator member.

Examples in accordance with a further aspect of the invention provide an actuation method, based on controlling an actuator member, the actuator member comprising an electroactive polymer deformable in response to electrical stimulation, and the method comprising: supplying to the actuator member an electrical stimulus comprising an actuation signal for deforming the actuator member, and an AC heating signal superposed with the actuation signal, and the method further comprising monitoring an output of a temperature sensing means (58), being arranged for obtaining a temperature at the actuator member, wherein an amplitude and/or frequency of the AC heating signal is adjusted in dependence upon said output so as to adjust the heating to thereby maintain the temperature of the actuator member at a set level, the set level being elevated relative to an initial non-heated temperature of the actuator member.

In examples, the method may comprise controlling the actuator member to function as a temperature sensing means by applying to the electroactive polymer of the actuator member an AC sensing signal of a frequency higher than that of the AC heating signal. This operation is described in more detail above.

BRIEF DESCRIPTION OF THE DRAWINGS

Examples of the invention will now be described in detail with reference to the accompanying drawings, in which.

DETAILED DESCRIPTION OF THE EMBODIMENTS

The invention provides an actuator device having a temperature sensing means and a controller adapted to apply a high frequency AC signal to stimulate internal self-heating in order thereby to maintain a temperature of an actuator member of the device at a set temperature, this temperature being elevated with respect to an initial temperature of the actuator member. This ensures that thermal drift may be mitigated or eliminated by compensating for any changes in environmental temperature through increasing or decreasing the level of the heating signal.

The invention makes use of electroactive polymers (EAPs) which, as noted above are a particular class of electroactive material. As noted, EAPs can work as sensors or actuators and can easily be manufactured into various shapes allowing easy integration into a large variety of systems.

Devices using electroactive polymers can be subdivided into field-driven and ionic-driven materials.

Examples of field-driven EAPs include Piezoelectric polymers, Electrostrictive polymers (such as PVDF based relaxor polymers) and Dielectric Elastomers. Other examples include Electrostrictive Graft polymers, Electrostrictive paper, Electrets, Electroviscoelastic Elastomers and Liquid Crystal Elastomers.

Examples of ionic-driven EAPs are conjugated/conducting polymers, Ionic Polymer Metal Composites (IPMC) and carbon nanotubes (CNTs). Other examples include ionic polymer gels.

Field-driven EAPs are actuated by an electric field through direct electromechanical coupling. They usually require high fields (volts per meter) but low currents. Polymer layers are usually thin to keep the driving voltage as low as possible.

Ionic EAPs are activated by an electrically induced transport of ions and/or solvent. They usually require low voltages but high currents. They require a liquid/gel electrolyte medium (although some material systems can also operate using solid electrolytes).

Both classes of EAP have multiple family members, each having their own advantages and disadvantages.

A first notable subclass of field-driven EAPs are Piezoelectric and Electrostrictive polymers. While the electromechanical performance of traditional piezoelectric polymers is limited, a breakthrough in improving this performance has led to PVDF relaxor polymers, which show spontaneous electric polarization (field-driven alignment). These materials can be pre-strained for improved performance in the strained direction (pre-strain leads to better molecular alignment). Normally, metal electrodes are used since strains usually are in the moderate regime (1-5%). Other types of electrodes (such as conducting polymers, carbon black based oils, gels or elastomers, etc.) can also be used. The electrodes can be continuous, or segmented.

Another subclass of interest of field-driven EAPs is that of Dielectric Elastomers. A thin film of this material may be sandwiched between compliant electrodes, forming a parallel plate capacitor. In the case of dielectric elastomers, the Maxwell stress induced by the applied electric field results in a stress on the film, causing it to contract in thickness and expand in area. Strain performance is typically enlarged by pre-straining the elastomer (requiring a frame to hold the pre-strain). Strains can be considerable (10-300%). This also constrains the type of electrodes that can be used: for low and moderate strains, metal electrodes and conducting polymer electrodes can be considered, for the high-strain regime, carbon black based oils, gels or elastomers are typically used. The electrodes can be continuous, or segmented.

In some cases, thin film electrodes are added when the polymer itself lacks sufficient conductivity (dimension-wise). The electrolyte can be a liquid, a gel or a solid material (i.e. complex of high molecular weight polymers and metal salts). Most common conjugated polymers are polypyrrole (PPy), Polyaniline (PANi) and polythiophene (PTh).

An actuator may also be formed of carbon nanotubes (CNTs), suspended in an electrolyte. The electrolyte forms a double layer with the nanotubes, allowing injection of charges. This double-layer charge injection is considered as the primary mechanism in CNT actuators. The CNT acts as an electrode capacitor with charge injected into the CNT, which is then balanced by an electrical double-layer formed by movement of electrolytes to the CNT surface. Altering the charge on the carbon atoms results in a change of C—C bond length. As a result, expansion and contraction of single CNT can be observed.

Figure 1:
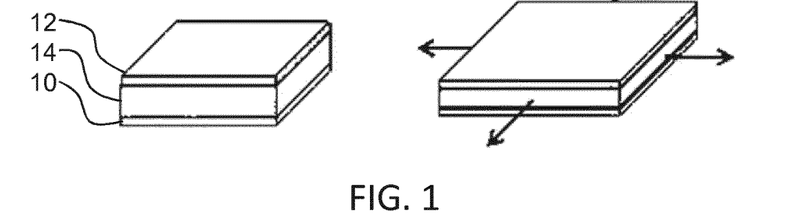
FIGS. 1 and 2 show two possible operating modes for an EAP device.
Figure 2:
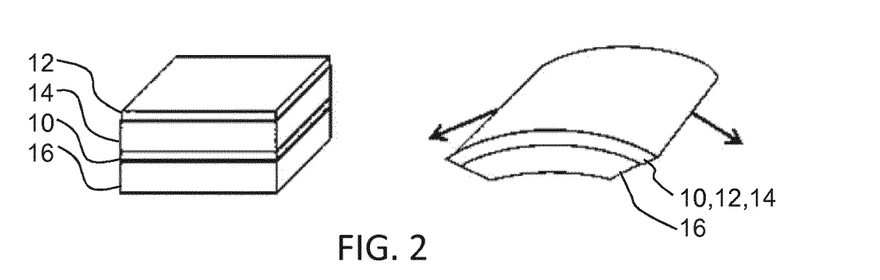

FIGS. 1 and 2 show two possible operating modes for an EAP device.

The device comprises an electroactive polymer layer 14 sandwiched between electrodes 10, 12 on opposite sides of the electroactive polymer layer 14.

FIG. 1 shows a device which is not clamped. A voltage is used to cause the electroactive polymer layer to expand in all directions as shown.

FIG. 2 shows a device which is designed so that the expansion arises only in one direction. The device is supported by a carrier layer 16. A voltage is used to cause the electroactive polymer layer to curve or bow.

Together, the electrodes, electroactive polymer layer, and carrier may be considered to constitute the overall electroactive polymer structure.

The nature of this movement for example arises from the interaction between the active layer, which expands when actuated, and the passive carrier layer. To obtain the asymmetric curving around an axis as shown, molecular orientation (film stretching) may for example be applied, forcing the movement in one direction.

The expansion in one direction may result from the asymmetry in the EAP polymer, or it may result from asymmetry in the properties of the carrier layer, or a combination of both.

An electroactive polymer structure as described above may be used both for actuation and for sensing. The most prominent sensing mechanisms are based on force measurements and strain detection. Dielectric elastomers, for example, can be easily stretched by an external force. By putting a low voltage on the sensor, the strain can be measured as a function of voltage (the voltage is a function of the area).

Another way of sensing with field-driven systems is measuring the capacitance-change directly or measuring changes in electrode resistance as a function of strain.

Piezoelectric and electrostrictive polymer sensors can generate an electric charge in response to applied mechanical stress (given that the amount of crystallinity is high enough to generate a detectable charge). Conjugated polymers can make use of the piezo-ionic effect (mechanical stress leads to exertion of ions). CNTs experience a change of charge on the CNT surface when exposed to stress, which can be measured. It has also been shown that the resistance of CNTs change when in contact with gaseous molecules (e.g. $O_2$, $NO_2$), making CNTs usable as gas detectors.

The invention is based on compensating for thermal drift in the actuator displacement. By thermal drift is meant uncontrolled drift or variation in the actuation displacement of the actuator, caused by changes in environmental temperature. It occurs because electroactive material expands with increasing temperature which causes non-negligible shifts in the actuation displacement of the actuator.

Figure 3:
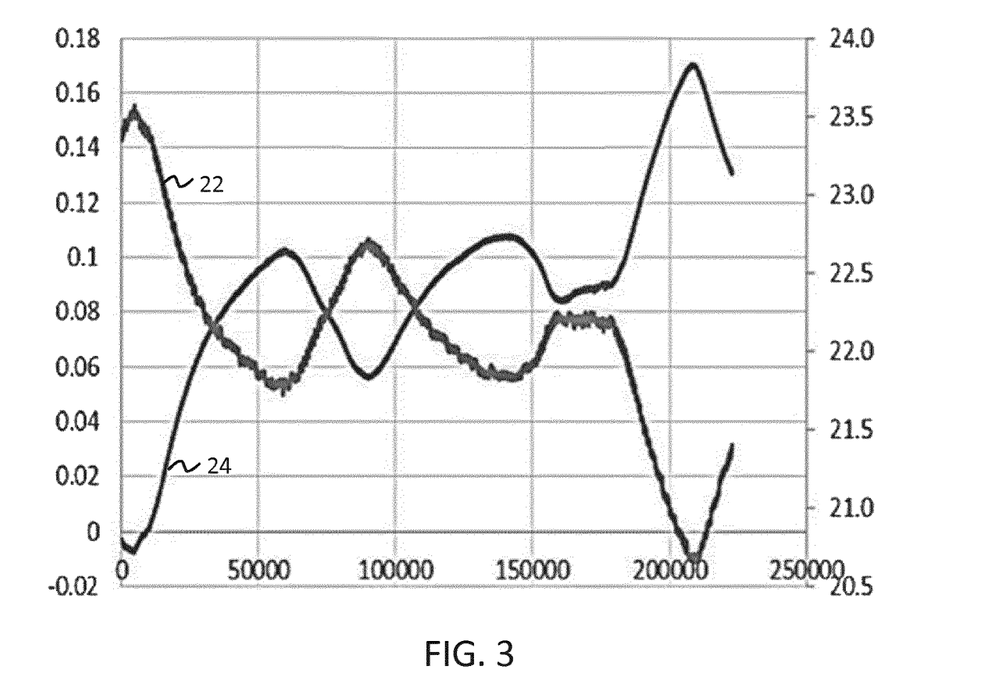
FIG. 3 shows a graph illustrating change in thermal drift with temperature.

By way of example, FIG. 3 shows the displacement (y-axis, left; mm) over time (x-axis; seconds) measured for a free standing relaxor ferroelectric electroactive polymer actuator as environmental temperature (y-axis, right; ° C.) is varied. Line 22 shows variation in displacement, while line 24 shows variation in temperature.

Figure 4:
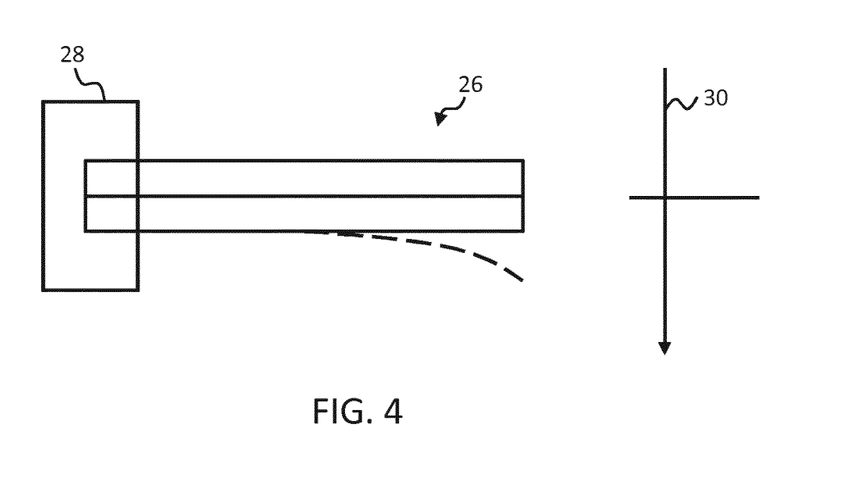
FIG. 4 illustrates a basic EAM actuator clamped at one edge.

No actuation voltage is applied. The displacement was measured for an actuator clamped at one edge, and measured along an axis running perpendicular to the plane of the layers of the actuator at a distance of 3 mm from the clamp. This is illustrated schematically in FIG. 4, which shows the EAP actuator 26 clamped at one edge by clamp element 28, and the displacement axis 30 along which displacement was measured, located 3 mm from the clamp member.

Returning to FIG. 3, over time the environment temperature fluctuates, resulting in a bending of the actuator. As a result of increasing temperature the actuator displacement increases (the actuator bends upwards). A temperature fluctuation of approximately 3° C. results in a deflection (drift) of approximately 0.15 mm. This is large relative to a typical actuation deflection, which is generally between 0-2 mm. For precision actuation applications (where much finer degrees of displacement are required) such a drift is especially large, and may even exceed the total desired displacement, or the desired change in displacement.

For relaxor ferroelectric EAP materials, the ideal operating temperature range for actuation is limited around the ferroelectric-paraelectric (F-P) transition temperature. In typical situations, the environmental temperature is no more than +/−10 degrees around this transition temperature.

For dielectric elastomer actuators the operating temperature must be higher than the glass transition temperature. For ionic actuators, the temperature is limited by the diffusion properties of the membrane layer and in case of wet systems (those making use of a liquid/gel electrolyte medium) ultimately by the boiling point of the liquid. Should the ion-carrying liquid boil, gas bubbles would be generated which would inhibit effective functionality, and may even result in explosion due to thermal expansion.

For precision applications, the actuator may suffer from drift if the temperature fluctuates during actuation. This is especially problematic for actuators that require long term precision actuation (e.g. holding a fixed displacement position or dynamically shifting between very small displacement intervals, such as sensor position corrections) under varying temperature conditions, for instance for EAPs arranged to operate in proximity to functional components which may heat up during use.

For precision applications, the actuator may be calibrated using a calibration technique. However, the calibration is performed at a certain fixed temperature. If the environmental temperature in use is different from the calibration temperature, the actuator may have an offset in actuation.

For instance, for in-body applications, the environmental temperature may vary from 36.5-37.5° C. for healthy subjects and up to 39° C. for patients with fever. These temperature differences can create an offset of 0.05-0.15 mm for the actuator in the example above.

For this reason, the invention proposes a compensation means for countering thermally-induced drift in actuation displacement. This invention proposes in particular implementation of self-heating of the EAP of the actuator member to maintain a slight temperature elevation of the internal temperature of the EAP, relative to an initial un-heated temperature, which can act as a thermal buffer against changes in environmental temperature. Changes can be sensed by an associated temperature sensing means, and the heating power adjusted to compensate for the change, and bring the temperature at the actuator member back to its initial elevated level.

By maintaining the temperature at a level slightly above an initial natural temperature level of the actuator member in the absence of heating, at the initial point of activation of the device, both decreases and increases in actuator member can be compensated for by increasing or decreasing the supplied heating power respectively.

The mechanism for self-heating, to increase the internal temperature of the EAP, is based on providing a high frequency AC signal superposed on top of any (quasi-)static actuation signal.

The high frequency AC heating signal is preferably of a frequency higher than the mechanical resonance frequency of the EAP actuator, and preferably also higher than the switching frequency of the EAP molecules. The switching frequency is the limiting frequency at which the molecules of the EAP can tolerate switches in polarization, hence limiting the frequency at which the EAP can be oscillated. If the heating frequency is higher than the switching frequency, the EAP will effectively be unable to accommodate the signal as a drive signal, and mechanical oscillation will accordingly be limited. This avoids the heating signal interfering with the actuation behavior of the actuator member, which should ideally be driven solely by the applied actuation signal.

Similarly, when the AC heating signal is applied at a frequency greater than the mechanical resonance frequency of the actuator member, resonant amplification of consequently induced oscillations in the actuator member does not occur (thereby limiting the amplitude of the induced actuation response), while the frequency is still great enough to induce sufficient heating in the actuator member to make the mechanism effective as a source of heating.

Preferably, the AC heating signal is at least 10 Hz higher than the mechanical resonance frequency of the actuator member. The actuation response of the actuator member will reduce as a (positive) function of the frequency of the applied AC signal. Therefore, in general, the greater the frequency of the applied signal (over approximately the mechanical resonance frequency of the actuator member), the less will be the magnitude or amplitude of any actuation response to the signal in the actuator member.

In addition, the intensity of the heating effect will in general also increase as a function of increasing frequency of the AC heating signal. Hence, the greater the frequency, in general both the greater the (desired) induced heating effect and the lower the (undesirable) induced actuation effect.

Where the frequency of the AC heating signal is very much higher, e.g. at least greater than 10 Hz higher or preferably greater than 20 Hz higher that the mechanical resonance frequency of the actuator member, then the mechanical oscillation induced in the EAP as a consequence of the heating signal is negligible.

At the same time, the voltage amplitude of the AC signal is provided high enough to provide significant electrical power, which is partly converted to heat by the electrical losses in the EAP, which in turn causes a temperature increase of the EAP. In this way, self-heating is achieved while not significantly interfering with the actuation behavior. This enables provision of the temperature buffer.

The mechanical resonance frequency may be determined in advance through a suitable measurement process. This may include simply vibrating the element at different frequencies and measuring the resultant oscillation effect with a vibration sensing means. The resonance frequency can be identified as a deviant spike in the output of the vibration sensing means for example.

Figure 5:
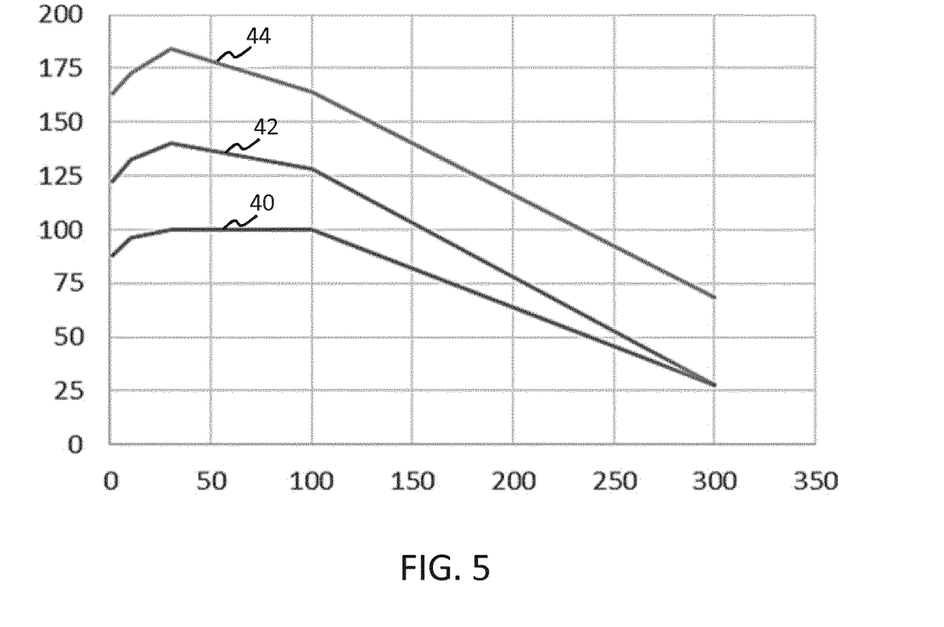
FIG. 5 illustrates induced mechanical oscillation as a function of AC frequency for each of three different self-heating signals at different voltage amplitudes.
Figure 6:
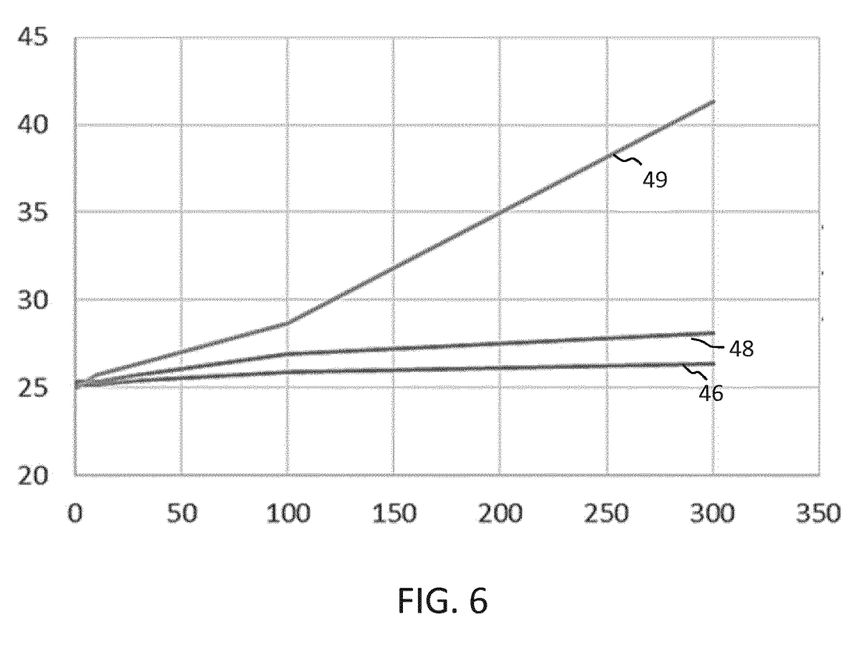
FIG. 6 illustrates the internal temperature of an EAP actuator stimulated with each of the heating signals of FIG. 5, as a function of AC frequency.

The principle of the self-heating mechanism is illustrated by way of example in FIGS. 5 and 6. FIG. 5 shows the induced mechanical oscillation amplitude (y-axis; μm) as a function of AC frequency (x-axis; Hz) for each of three different self-heating signals, each having different AC voltage amplitude. Line 40 shows a heating signal of oscillation amplitude 20 V, about a baseline of 100V (i.e. V=100 V+/−20 V). Line 42 shows a heating signal of oscillation amplitude 30 V, about a baseline of 100 V (i.e. V=100 V+/−30 V). Line 44 shows a heating signal of oscillation amplitude 40 V, about a baseline of 100 V (i.e. V=100 V+/−40 V).

FIG. 6 shows the corresponding internal temperature of the EAP actuator (y-axis; ° C.) stimulated with each of the heating signals of FIG. 5, as a function of AC frequency (x-axis; Hz) of the signal. Line 46 corresponds to signal 40 of FIG. 5 (Voltage amplitude V=100 V+/−20 V). Line 48 corresponds to signal 42 of FIG. 5 (Voltage amplitude V=100 V+/−30 V). Line 49 corresponds to signal 44 of FIG. 5 (Voltage amplitude V=100 V+/−40 V).

As illustrated in FIG. 5, at an AC frequency of 300 Hz, only very light mechanical oscillations (of around 25 μm) are induced by the signal of oscillation amplitude 30 V (Lines 42 and 48), while a significant temperature increase of +3° C. is achieved. A temperature compensation capacity of 3° C. can counteract a temperature-induced displacement drift of 0.15 mm, i.e. a displacement 6 times greater than the induced mechanical oscillation amplitude. At the expense of higher induced mechanical oscillation amplitude, an even greater temperature buffer can be realized (as indicated by FIGS. 5 and 6).

Where the EAP temperature is at a temperature several degrees higher than the ambient environmental temperature, small fluctuations in the ambient temperature are of less influence on the EAP temperature. The EAP may in examples be made several degrees higher than an initial starting (idle) temperature of the EAP (which should by default be approximately equal to an ambient environmental temperature). Larger fluctuations in ambient temperature may be compensated for by adjusting a voltage amplitude, or the frequency, of the AC heating signal applied to the EAP. Decreases in temperature may be compensated by increases in amplitude or frequency of the heating signal, and vice versa.

Embodiments of the invention are hence highly advantageous in temperature environments which are subject to (in particular, small, e.g. from 1° C. to 3° C. or 1° C. to 5° C.) temperature change(s) during actuation.

Figure 7:
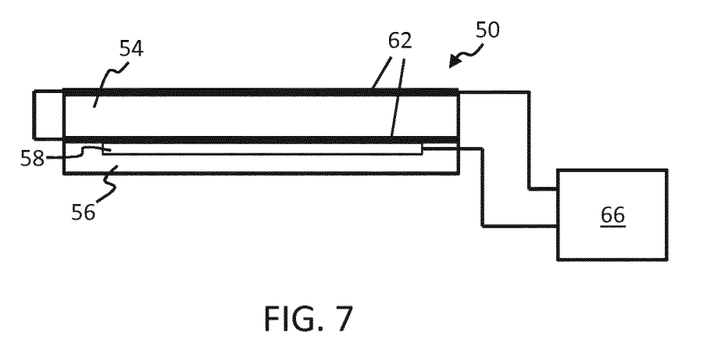
FIG. 7 shows an example actuator device in accordance with one or more embodiments of the invention.

FIG. 7 schematically depicts a first example actuator device in accordance with one or more embodiments of the invention. The device comprises an actuator member 50, comprising an active EAP layer 54 coupled to a passive backing layer 56. The backing layer incorporates a thin film temperature sensor 58 arranged in thermal communication, and preferably direct physical contact, with the active EAP layer 54. The temperature sensor is configured to sense the temperature of the active EAP layer, to thereby enable implementation of a feedback mechanism to enable real-time temperature compensation.

A pair of electrodes 62 surrounds the active EAP layer 54 for applying an electric field across the EAP layer to thereby stimulate deformation of the layer and induce actuation. The backing layer 56 constricts in-plane expansion of the EAP layer, thereby inducing a bending actuation action.

The electrodes 62 and the temperature sensor 58 are both operatively coupled with a controller 66. The controller in the present case is configured to control both actuation of the actuator member 50 and self-heating of the actuator member, through application of appropriate DC or AC actuation signals (electric fields in the present example) to the actuator member via the electrodes. The controller is configured to receive a sensor output from the temperature sensor 58, and to adjust a power level of an applied AC-heating signal accordingly.

Upon activation of the device, the controller 66 applies an initial AC heating signal of a power sufficient to elevate the temperature of the EAP active layer at least a few degrees above its initial temperature, or a few degrees above an ambient temperature of the environment surrounding the actuator member 50.

In examples, this may be achieved by establishing an initial temperature of the EAP active layer 54 or the ambient environment, via for instance estimation or via a reading received from the temperature sensor 58, and subsequently applying a heating signal of frequency and voltage amplitude sufficient to raise the temperature of the active layer a few degrees e.g. from 2 to 4° C., above the initial established temperature.

Alternatively, the controller may be adapted simply to apply an initial AC heating signal having a pre-set power level (i.e. pre-set frequency and amplitude), this signal being known to induce, in the typical temperature environments in which the device is envisaged for application, a temperature elevation of the desired amount.

Following establishment of the elevated temperature level in the EAP active layer, the controller 66 is configured to monitor the temperature readings sensed by the temperature sensor 58. Sensed changes may be responded to by varying a power of the applied AC heating signal, either through varying a voltage amplitude or varying a frequency of the signal. The controller may be configured to only respond where the temperature change exceeds some minimum threshold. This may be a pre-set threshold for instance, or input by a user through a user input means additionally provided or communicatively coupled with the controller.

Where the controller 66 detects via the temperature sensor 58 an increase in the temperature of the active EAP layer, it may respond by decreasing a power level of the applied AC heating signal, to thereby reduce the overall temperature of the active layer 54 back to its previous level and thereby prevent or reverse any possible thermally-induced drift in actuation displacement. Likewise, where the controller 66 detects via the temperature sensor 58 a decrease in the temperature of the active EAP layer 54, it may respond by increasing a power level of the applied AC heating signal, to thereby bring the temperature of the active layer back up to its previous level. Again this prevents or reverses any thermally-induced shift in the actuation displacement of the actuator.

A temperature sensor is preferably located in close proximity to the EAP active layer 54. Advantageously, it may be arranged on the backing layer 56 of the actuator member 50, as in the example of FIG. 7.

Figure 8:
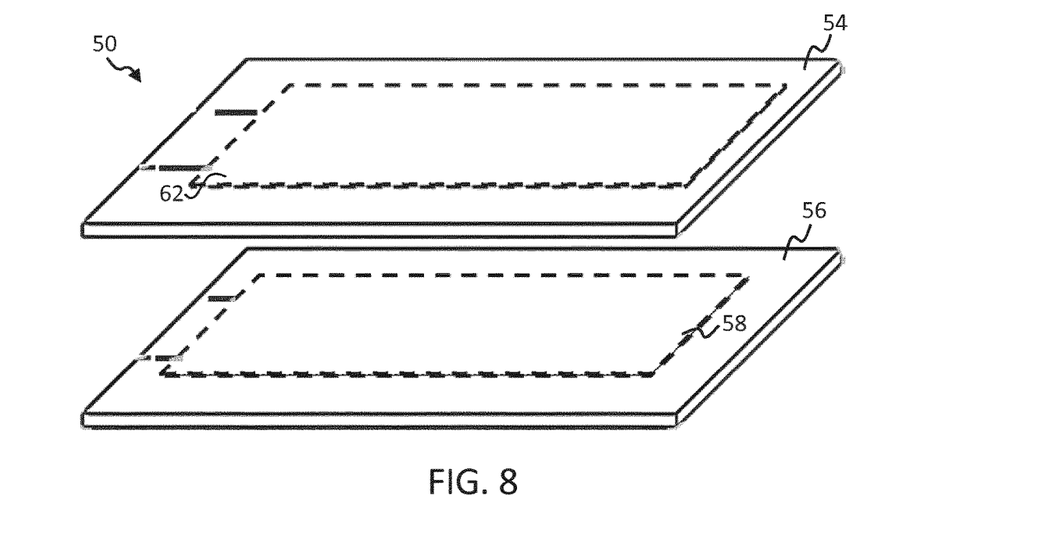
FIG. 8 shows an exploded view of an actuator member of the actuator device of FIG. 7.

This is shown in more detail in FIG. 8 which shows an exploded view of the active EAP layer 54 and the passive backing layer 56 of the actuator member 50, the backing layer having a thin film temperature sensor 58 disposed across its upper (coupling) surface. When the two layers are coupled to one another, it can be seen that the thin-film temperature sensor will be disposed in very close proximity to a lower (coupling) surface of the active layer 54.

As noted, the AC voltage (or frequency) of the AC heating signal is adjusted in dependence upon a temperature that is measured by the temperature sensor 58 such that the adjustment in applied AC voltage (and the correlated internal heat generated in the EAP) compensates any change in EAP or ambient temperature and the EAP temperature stays constant. The sensor should ideally be arranged in close proximity to the EAP, or with as effective a thermal coupling as possible, so as to ensure the sensor follows the same temperature fluctuations as the actuator member with maximal precision. Preferably, the backing material of the bending actuator may be configured as a thin-film temperature sensor.

The above example makes use of a thin film temperature sensor. The backing layer 56 may be configured as a thin-film temperature sensor as illustrated in FIG. 8. This may be realised by coupling or otherwise disposing a thin-film temperature sensor as known in the art to the backing layer 56 for example, such that, when assembled, the actuator member 50 comprises said thin film sensor, situated between the backing layer and the active layer 54.

Although a thin-film temperature sensor 58 is utilized in the above example of FIGS. 7 and 8, this is by way of illustration only. In other examples, any other suitable form of temperature sensor may be utilized. Advantageously, this may be incorporated within the body of the backing layer 56 such that the sensor is disposed in thermal communication with a coupling surface of the EAP active layer 54. Where a thicker sensor is used, the sensor may occupy a portion of the body of the layer, for instance by molding the layer around the sensor (ensuring a sensing surface is left exposed), or by otherwise embedding the sensor within a coupling surface of the backing layer.

Any other suitable form of temperature sensing means for sensing a temperature at or of the EAP actuating layer 54 may be used.

In accordance with one or more further examples, the EAP of the active layer 54 itself may be controlled to provide a temperature sensing function. This control mechanism is described in WO 2017/037117 for instance, and is based upon applying to the electroactive polymer of the actuator member an AC sensing signal of a frequency higher than that of the AC heating signal. The impedance of such an applied signal is directly related to a temperature of the EAP material. By monitoring the impedance, a measure of the temperature of the active layer 54 of the actuator member 50 may be derived.

This mechanism for sensing is temperature is based upon the intrinsic pyroelectric response of EAP materials, which allows them to be used for temperature sensing. The mechanism is explained in more detail in WO 2017/037117 (see in particular for instance page 19, line 28 to page 20, line 3 which explains how to isolate temperature measurements in particular from measurements of other parameters such as load).

By ensuring the frequency of the sensing signal is higher than that of the heating signal, temperature sensing and heating can be performed simultaneously, and without mutual interference.

The AC sensing signal preferably has an amplitude which is lower than an amplitude of the AC heating signal, and which is lower than a magnitude or amplitude of the actuation signal. This avoids the sensing signal interfering with either the heating operation implemented by the AC heating signal or the actuation behavior, controlled by the actuation signal.

As noted, the AC sensing signal may be applied simultaneously with the AC heating signal. Alternatively, the two signals can be applied sequentially, for instance in alternating or cyclic fashion. Alternatively again, the AC heat generation can be temporarily switched off when sensing is to be performed, allowing a short time window to perform the temperature sensing in isolation of the heating signal.

In examples, the frequency of the AC sensing signal may be controlled to be from 10 kHz to 100 kHz. Advantageously, the frequency may be greater than 20 kHz. However, these exemplary frequencies are presented as just one example of frequencies which are known to be particularly advantageous when implemented in embodiments of the invention. Other frequencies may also be used, and the invention is by no means limited to these example frequencies.

In preferred examples, the actuator member may be adapted so as to enhance its heat capacity. This ensures that the device is more resistant to temperature changes, thereby minimizing the impact of environmental temperature variations upon displacement.

In accordance with examples, enhanced or increased heat capacity may be achieved by adding relatively thick insulating seal around the outside of the EAP or increasing the (internal) heat capacity of the EAP actuator member 50. This can be accomplished for instance by providing a backing layer 56 of a material with high water content. Additionally or alternatively, it may be achieved by adding particles to the EAP active layer 54, the backing layer 56, and/or said sealing material, the particles having a high specific heat capacity. The particles may for instance comprise a material comprising long chain hydrocarbons (such as for instance paraffin and polyethylene). In particular, rubbers (natural or synthetic) are good candidates for a sealing material, since they are flexible (making them particularly suitable for encasing or wrapping around a deforming or bending actuator), have a low thermal conductivity and have a high specific heat capacity.

In accordance with one or more alternative examples of the actuator device, the device may comprise an ambient temperature sensing means, i.e. means for sensing a temperature of the ambient environment surrounding the actuator member. In this case the controller 66 should be calibrated such that for each measured ambient temperature, it can either be known a corresponding likely EAP temperature, or it can be known the required AC heating signal amplitude and/or frequency for maintaining the EAP at a desired temperature. These figures may be stored for instance in a lookup table, for instance within a memory comprised by the controller, or communicatively accessible by the controller, for instance through a network or other communication channel.

The present invention provides an EAP with self-heating mechanism implemented by a controller for compensating or countering temperature changes, in order thereby to provide a temperature buffer and avoid thermally-induced displacement drift, but while keeping actuation displacement disturbance at a minimum. The self-heating compensation may be implemented independent of actuation drive signals.

The fact that there is an advantageous window of frequency and amplitude at which the AC heating signal may realize significant temperature changes, but with only minimal displacement disturbance is not at all obvious, but has been validated by experiments, and shown for instance in FIGS. 5 and 6.

The present invention is based on countering environmental temperature changes through electrically induced self-heating of the actuator member. The general physical principles of this control mechanism have been tested in a simple demonstration experiment, the results of which will now be discussed with reference to FIG. 9.

Figure 9:
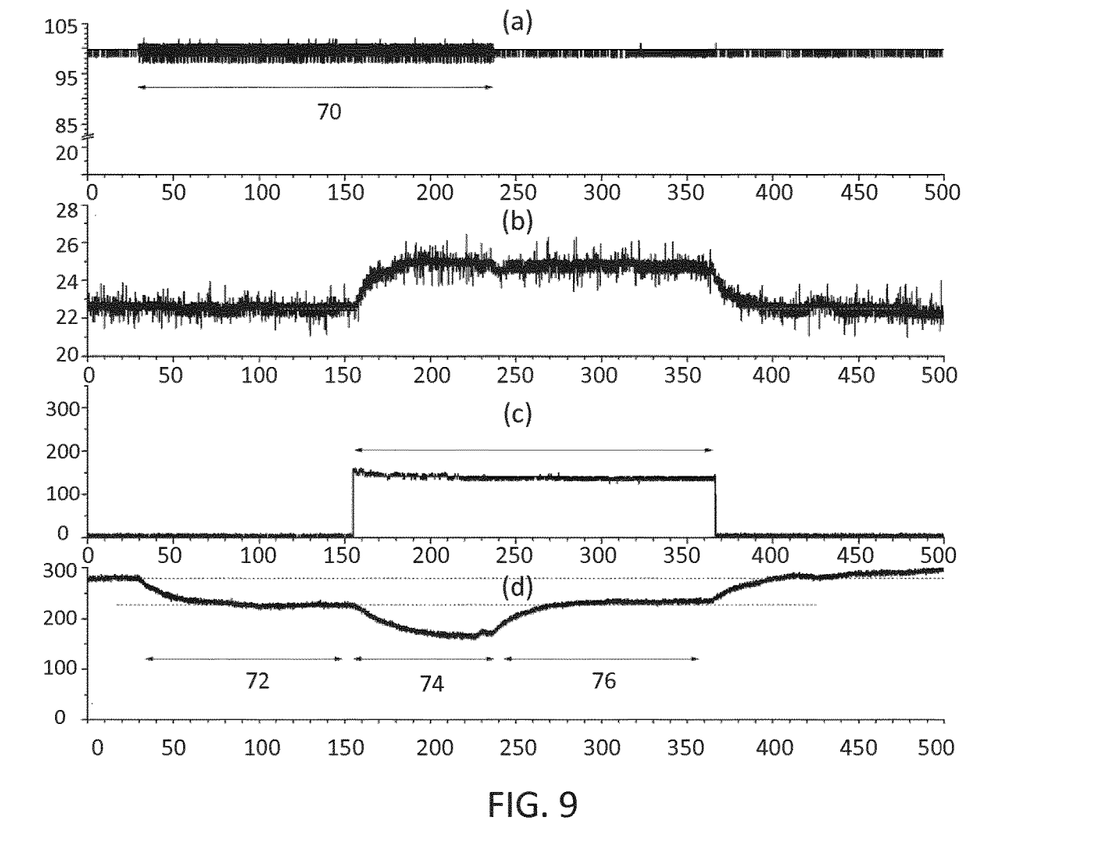
FIG. 9 shows results of a test demonstration of the self-heating compensation mechanism implemented by embodiments of the present invention.

FIG. 9 shows results of experimentation to demonstrate the physical effects of ambient temperature changes and of an applied AC heating signal upon actuator displacement. The experiment sought to test and demonstrate the general physical effects, rather than to implement any particular controlled compensation mechanism.

FIG. 9(a) shows the drive voltage (y-axis; V) applied to the actuator member as a function of time (x-axis; s). The AC-heating signal is only applied during the period indicated by the horizontal arrow 70. For the remainder of the time, a constant DC signal of magnitude 100 V is applied. When the AC signal is applied, it is applied superposed with the DC signal, with an amplitude of 5 V, and a frequency of 20 kHz.

FIG. 9(b) shows the (deliberately induced) change in environmental temperature (y-axis; ° C.) as a function of time (x-axis; s). The change in temperature is induced though operation of a heater, whose input power as a function of time is shown in FIG. 9(c), with the y-axis showing input power (mV) and the x-axis showing time (s).

FIG. 9(d) shows the actuation displacement (y-axis; µm) of the actuator member as a function of time (x-axis; s).

During the time period indicated by arrow 72, the AC-heating signal is applied to the actuator member, while the ambient temperature remains static at around 23° C. As shown in FIG. 9(d), the consequence of this is a (negative) change in the actuation displacement of the actuator member, reducing from a displacement of around 275 µm to around 225 µm. This occurs by virtue of the heating effect induced by the AC heating signal, which leads to the demonstrated change in displacement. It is this effect which allows the AC-heating signal to provide effective compensatory control against thermally induced displacement drift.

During subsequent time period 74, the AC heating signal remains activated and, at the same time, the heater is activated, thereby raising the ambient temperature from approximately 23° C. to approximately 25° C. As shown in FIG. 9(d), this leads to a further decrease in actuation displacement, reducing the displacement from around 225 µm to around 175 µm.

During subsequent period 76, the ambient temperature remains elevated, but the AC-heating signal is deactivated. As a consequence, the deflection of the actuator member increases back from around 175 μm to around 225 μm. It can be seen from this how, in implementation of embodiments of the present invention, increases in ambient temperature can in general be countered or compensated by commensurate decreases in the power of the AC-heating signal power. In particular, where the AC heating signal is consistently applied at a low level, increases in ambient temperature may be compensated by reducing this low level AC heating power to thereby maintain the resultant temperature of the actuator member at a constant level.

Finally, as shown in FIG. 9, following period 76, both the heater (FIG. 9(*c*)) and the AC signal are deactivated, resulting in a return of the actuator member to its original deflection of around 275 μm.

In accordance with any embodiment of the invention, the level of heating induced in the actuator member by the AC-heating signal may be varied through varying either the voltage amplitude of the AC heating signal or alternatively the frequency of the AC heating signal. A higher frequency will result in a heating signal of greater power. This will in turn result in transfer of greater thermal energy into the actuator member through greater electrical losses incurred in the member when the heating signal is applied. Hence frequency, as well as voltage amplitude, may be used to control the level of heating applied to the actuator member.

Embodiments of the invention have application in any device in which a small actuator of high force and stroke power may be of value. Particular applications in which such an actuator may be highly valuable include (but are by no means limited to): personal care devices (e.g. shavers, trimmers, and/or skin care devices), oral healthcare devices (e.g. toothbrushes, tongue-cleaners, mouthpieces, and/or air floss devices), personal health devices (e.g. handheld or wearable devices), and/or medical devices (e.g. catheters, guide wires and/or CMUT based devices).

Materials suitable for electroactive material of the actuator member are known.

Electro-active polymers include, but are not limited to, the sub-classes: piezoelectric polymers, electromechanical polymers, relaxor ferroelectric polymers, electrostrictive polymers, dielectric elastomers, liquid crystal elastomers, conjugated polymers, Ionic Polymer Metal Composites, ionic gels and polymer gels.

The sub-class electrostrictive polymers includes, but is not limited to:

Polyvinylidene fluoride (PVDF), Polyvinylidene fluoride-trifluoroethylene (PVDF-TrFE), Polyvinylidene fluoride-trifluoroethylene-chlorofluoroethylene (PVDF-TrFE-CFE), Polyvinylidene fluoride-trifluoroethylene-chlorotrifluoroethylene) (PVDF-TrFE-CTFE), Polyvinylidene fluoride-hexafluoropropylene (PVDF-HFP), polyurethanes or blends thereof.

The sub-class dielectric elastomers includes, but is not limited to: acrylates, polyurethanes, silicones.

The sub-class conjugated polymers includes, but is not limited to: polypyrrole, poly-3,4-ethylenedioxythiophene, poly(p-phenylene sulfide), polyanilines.

In all of these examples, additional passive layers may be provided for influencing the electrical and/or mechanical behavior of the EAP element in response to an applied electric field.

Each EAP element may be sandwiched between electrodes. The electrodes may be stretchable so that they follow the deformation of the EAP material. Materials suitable for the electrodes should be ultrasound-transmissive and include for instance thin metal films, such as gold, copper, or aluminum or organic conductors such as carbon black, carbon nanotubes, graphene, poly-aniline (PANI), poly(3,4-ethylenedioxythiophene) (PEDOT), e.g. poly(3,4-ethylene-dioxythiophene) poly(styrenesulfonate) (PEDOT:PSS).

If the electrodes are arranged in a non-symmetric configuration, the imposed voltage can induce all kinds of deformations such as twisting, rolling, torsioning, turning, and non-symmetric bending deformation.

As discussed above, embodiments of the invention make use of a controller. The controller can be implemented in numerous ways, with software and/or hardware, to perform the various functions required. A processor is one example of a controller which employs one or more microprocessors that may be programmed using software (e.g., microcode) to perform the required functions. A controller may however be implemented with or without employing a processor, and also may be implemented as a combination of dedicated hardware to perform some functions and a processor (e.g., one or more programmed microprocessors and associated circuitry) to perform other functions.

Examples of controller components that may be employed in various embodiments of the present disclosure include, but are not limited to, conventional microprocessors, application specific integrated circuits (ASICs), and field-programmable gate arrays (FPGAs).

In various implementations, a processor or controller may be associated with one or more storage media such as volatile and non-volatile computer memory such as RAM, PROM, EPROM, and EEPROM. The storage media may be encoded with one or more programs that, when executed on one or more processors and/or controllers, perform the required functions. Various storage media may be fixed within a processor or controller or may be transportable, such that the one or more programs stored thereon can be loaded into a processor or controller.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

We claim the following:

1. An actuator device, comprising:
   an actuator member comprising an electroactive polymer deformable in response to electrical stimulation,
   a temperature sensing means in thermal communication with the actuator member and adapted to obtain a measure of a temperature at the actuator member; and
   a controller operatively coupled to the temperature sensing means and arranged to supply to the actuator member, an electrical stimulus comprising an actuation signal for deforming the actuator member, and an AC heating signal superposed with the actuation signal for inducing heating of the electroactive polymer,
   wherein the controller is adapted to define a set temperature level for the actuator member, the set temperature level being a temperature elevated relative to an initial non-heated temperature of the actuator member, and
   wherein the controller is adapted to monitor an output of the temperature sensing means and adjust one or more of an amplitude and frequency of the AC heating signal in dependence upon the output so as to adjust the heating to maintain the temperature of the actuator member at a set level, the set level being a level elevated relative to the initial non-heated temperature of the actuator member.

2. The actuator device of claim 1, wherein the actuator member has a mechanical resonance frequency, and wherein the AC heating signal is of a frequency greater than said mechanical resonance frequency.

3. The actuator device of claim 1, wherein said set temperature level is elevated in addition relative to a reference ambient environmental temperature, and optionally wherein the actuator device further comprises an environmental temperature sensing means for acquiring the reference ambient environmental temperature.

4. The actuator device of claim 3, wherein said set level is elevated from 2° C. to 7° C. higher than one or more of the initial non-heated actuator member temperature and the reference ambient environmental temperature.

5. The actuator device of claim 1, wherein the controller is adapted to decrease one or more of the frequency and amplitude of the AC heating signal in response to a sensed increase in the temperature of the actuator member, and to increase one or more of the frequency and amplitude of the AC heating signal in response to a sensed decrease in the temperature of the actuator member.

6. The actuator device of claim 1, wherein the frequency of the AC heating signal is controlled to be from 100 Hz to 1000 Hz.

7. The actuator device of claim 1, wherein the temperature sensing means comprises a temperature sensor thermally coupled to the actuator member, and optionally wherein the temperature sensor is directly coupled to a backing layer of the actuator member.

8. The actuator device of claim 1, wherein the controller is further adapted to control the actuator member to function as the temperature sensing means by applying to the electroactive polymer of the actuator member, an AC sensing signal of a frequency higher than that of the AC heating signal.

9. The actuator device of claim 8, wherein the AC sensing signal is applied simultaneously with the AC heating signal, or wherein the AC sensing signal and AC heating signal are applied non-simultaneously, in sequential fashion.

10. The actuator device of claim 8, wherein the frequency of the AC sensing signal is controlled to be from 10 kHz to 100 kHz.

11. The actuator device of claim 1, further comprising a thermal insulation material arranged surrounding the actuator member, and optionally wherein said thermal insulation material comprises a long chain hydrocarbon material.

12. The actuator device of claim 1, wherein at least a portion of the actuator member comprises a long chain hydrocarbon material.

13. An actuation method, based on controlling an actuator member, the actuator member comprising an electroactive polymer deformable in response to electrical stimulation, the method comprising:
supplying to the actuator member, an electrical stimulus comprising an actuation signal for deforming the actuator member, and an AC heating signal superposed with the actuation signal,
monitoring an output of a temperature sensing means in thermal communication with the actuator member, and being arranged for obtaining a temperature at the actuator member, and
defining a set temperature level for the actuator member, the set temperature level being a temperature elevated relative to an initial non-heated temperature of the actuator member,
wherein one or more of an amplitude and frequency of the AC heating signal is adjusted in dependence upon said output so as to adjust the heating to maintain the temperature of the actuator member at a set level, the set level being a level elevated relative to the initial non-heated temperature of the actuator member.

14. The method of claim 13, wherein the actuator member has a mechanical resonance frequency, and wherein the AC heating signal of said electrical stimulus is of a frequency greater than said mechanical resonance frequency of the actuator member.

15. The method of claim 13, wherein the method further comprises controlling the actuator member to function as the temperature sensing means by applying to the electroactive polymer of the actuator member, an AC sensing signal of a frequency higher than that of the AC heating signal.

* * * * *